US009860971B2

(12) United States Patent
Shim

(10) Patent No.: US 9,860,971 B2
(45) Date of Patent: Jan. 2, 2018

(54) SHIELD CAN STRUCTURE

(71) Applicant: Samsung Electronics Co., Ltd, Gyeonggi-do (KR)

(72) Inventor: Seung Bo Shim, Gyeonggi-do (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/356,486

(22) Filed: Nov. 18, 2016

(65) Prior Publication Data
US 2017/0142823 A1  May 18, 2017

(30) Foreign Application Priority Data

Nov. 18, 2015  (KR) .................. 10-2015-0161492

(51) Int. Cl.
| | |
|---|---|
| H05K 7/14 | (2006.01) |
| H05K 9/00 | (2006.01) |
| H05K 1/02 | (2006.01) |
| H05K 1/18 | (2006.01) |
| H04M 1/02 | (2006.01) |
| H05K 3/30 | (2006.01) |

(52) U.S. Cl.
CPC ........ *H05K 1/0216* (2013.01); *H04M 1/0277* (2013.01); *H05K 1/181* (2013.01); *H05K 9/00* (2013.01); *H05K 3/303* (2013.01)

(58) Field of Classification Search
CPC ... H05K 9/0024; H05K 9/0032; H05K 9/0007

USPC ........................................ 361/800, 816, 818
See application file for complete search history.

(56) References Cited

U.S. PATENT DOCUMENTS

| | | | |
|---|---|---|---|
| 7,660,132 B2* | 2/2010 | Tanaka ................. | H05K 3/3405 361/736 |
| 2015/0264842 A1* | 9/2015 | Song .................... | H05K 9/0032 361/714 |
| 2016/0066482 A1* | 3/2016 | Chi ...................... | H05K 9/0032 174/378 |
| 2016/0227680 A1* | 8/2016 | Hyun ................... | H05K 9/0024 |
| 2016/0242331 A1* | 8/2016 | Park ...................... | H05K 9/002 |

FOREIGN PATENT DOCUMENTS

KR          100293940 B1     4/2001

* cited by examiner

*Primary Examiner* — Sherman Ng

(57) ABSTRACT

An electronic device includes a housing comprising a first plate, a second plate, and a side member, a printed circuit board arranged inside the housing and comprises a first surface, a second surface, and at least one side surface t, a first electronic component mounted on the first surface, a second electronic component mounted on the second surface, a first shield frame formed on the first surface and has a first opening, a second shield frame formed on the second surface and has a second opening, and a first shield cover comprising a first cover part and a first side part. The first cover part is supported by the first shield frame and covers the first electronic component. The first side part extends from the first cover part to the second shield frame and is covers the printed circuit board, the first opening, and a portion of the second opening.

20 Claims, 14 Drawing Sheets

SHIELD CAN STRUCTURE

CROSS-REFERENCE TO RELATED APPLICATION(S) AND CLAIM OF PRIORITY

The present application is related to and claims the benefit under 35 U.S.C. §119(a) of a Korean patent application filed on Nov. 18, 2015 in the Korean Intellectual Property Office and assigned Serial Number 10-2015-0161492, the entire disclosure of which is hereby incorporated by reference.

TECHNICAL FIELD

The present disclosure relates to a shield can structure.

BACKGROUND

Various electronic components may be mounted on an electronic device such as a smartphone. For example, electronic elements or circuit lines may be mounted on a printed circuit board (PCB), and at least some of them may be electrically connected to each other. Meanwhile, electromagnetic waves may be generated by the electronic components. The electromagnetic waves generated by the electronic components may be harmful to the human body, and may act as noise against a device that is vulnerable to the electromagnetic waves. Accordingly, when the electronic components are mounted on the printed circuit board, the electronic components may be covered by a shield can or the like that may shield electromagnetic waves.

If a shield frame of the shield can, which is coupled to a printed circuit board, is formed to be long, an area in which the shield frame and the printed circuit board contact each other is widened during a surface mounted device (SMD) process so that a portion of the shield frame may come out from the printed circuit board. Accordingly, in the existing shield can structure, an area in which the shield frame contacts the printed circuit board may be reduced by arranging one or more openings at a lower end of a side surface of the shield frame at a specific interval, thereby making it possible to prevent a portion of the shield frame from coming out.

However, electromagnetic waves may be introduced and discharged through an opening formed at a lower end of a side surface of the shield frame. Accordingly, the electromagnetic waves introduced and discharged through the opening may badly influence the human body and may cause malfunctions of the electronic components.

Further, in the existing shield can structure, a shield frame and a shield cover may match with each other on the upper and lower surfaces of the printed circuit board, respectively, so that shield cans may be provided on the upper and lower surfaces of the printed circuit board. For example, the shield frames may be coupled to the upper and lower surfaces of the printed circuit board, respectively, and the shield covers may be arranged on the shield frame to cover the electronic components arranged within the shield can. However, the structure may make it difficult to interrupt the electromagnetic waves generated on the side surfaces of the printed circuit board.

The above information is presented as background information only to assist with an understanding of the present disclosure. No determination has been made, and no assertion is made, as to whether any of the above might be applicable as prior art with regard to the present disclosure.

SUMMARY

To address the above-discussed deficiencies, it is a primary object to provide a structure of a shield can in which a shield cover covers an opening formed in a shield frame and a portion of a side wall of a printed circuit board.

In accordance with an aspect of the present disclosure, an electronic device includes a housing comprising a first plate, a second plate separated from the first plate, and a side member that surrounds at least a portion of a space between the first plate and the second plate, a printed circuit board arranged inside the housing and comprises a first surface that faces a first direction, a second surface that faces a second direction that is opposite to the first direction, and at least one side surface that faces a direction that is different from the first direction and the second direction, a first electronic component mounted on the first surface, a second electronic component mounted on the second surface, a first shield frame formed on the first surface to surround at least a part of the first electronic component and has a first opening in at least an area thereof, a second shield frame formed on the second surface to surround at least a part of the second electronic component and has a second opening in at least an area thereof, and a first shield cover comprising a first cover part and a first side part. The first cover part is supported by the first shield frame and is formed to cover an upper portion of the first electronic component. The first side part extends from the first cover part to a portion of the second shield frame and is formed to cover at least one side surface of the printed circuit board, the first opening, and at least a portion of the second opening.

Other aspects, advantages, and salient features of the disclosure will become apparent to those skilled in the art from the following detailed description, which, taken in conjunction with the annexed drawings, discloses various embodiments of the present disclosure.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

Throughout the drawings, it should be noted that like reference numbers are used to depict the same or similar elements, features, and structures.

DETAILED DESCRIPTION

Figure 1:
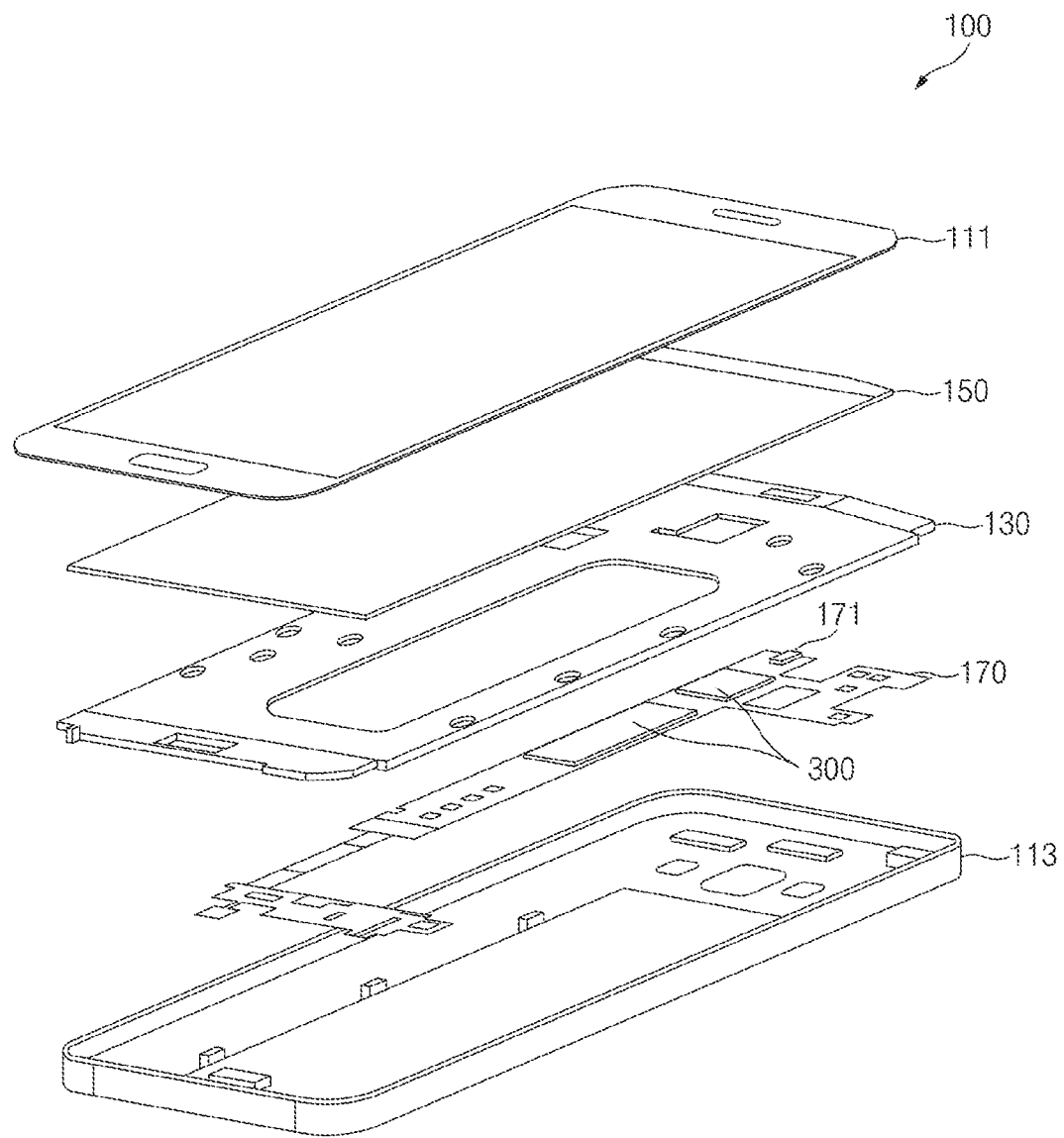
FIG. 1 illustrates an exploded perspective view of an electronic device according to various embodiments of the present disclosure.

FIGS. 1 through 7, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device.

Hereinafter, various embodiments of the present disclosure are disclosed with reference to the accompanying drawings. However, the present disclosure is not intended to be limited by the various embodiments of the present disclosure to a specific embodiment and it is intended that the present disclosure covers all modifications, equivalents, and/or alternatives of the present disclosure provided they come within the scope of the appended claims and their equivalents. With respect to the descriptions of the accompanying drawings, like reference numerals refer to like elements.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The term "include," "comprise," and "have", or "may include," or "may comprise" and "may have" used herein indicates disclosed functions, operations, or existence of elements but does not exclude other functions, operations or elements.

For example, the expressions "A or B," or "at least one of A and/or B" may indicate A and B, A, or B. For instance, the expression "A or B" or "at least one of A and/or B" may indicate (1) at least one A, (2) at least one B, or (3) both at least one A and at least one B.

The terms such as "1st," "2nd," "first," "second," and the like used herein may refer to modifying various different elements of various embodiments of the present disclosure, but are not intended to limit the elements. For instance, "a first user device" and "a second user device" may indicate different users regardless of order or importance. For example, a first component may be referred to as a second component and vice versa without departing from the scope and spirit of the present disclosure.

In various embodiments of the present disclosure, it is intended that when a component (for example, a first component) is referred to as being "operatively or communicatively coupled with/to" or "connected to" another component (for example, a second component), the component may be directly connected to the other component or connected through another component (for example, a third component). In various embodiments of the present disclosure, it is intended that when a component (for example, a first component) is referred to as being "directly connected to" or "directly accessed" another component (for example, a second component), another component (for example, a third component) does not exist between the component (for example, the first component) and the other component (for example, the second component).

The expression "configured to" used in various embodiments of the present disclosure may be interchangeably used with "suitable for," "having the capacity to," "designed to," "adapted to," "made to," or "capable of" according to the situation, for example. The term "configured to" may not necessarily indicate "specifically designed to" in terms of hardware. Instead, the expression "a device configured to" in some situations may indicate that the device and another device or part are "capable of." For example, the expression "a processor configured to perform A, B, and C" may indicate a dedicated processor (for example, an embedded processor) for performing a corresponding operation or a general purpose processor (for example, a central processing unit (CPU) or application processor (AP)) for performing corresponding operations by executing at least one software program stored in a memory device.

Terms used in various embodiments of the present disclosure are used to describe certain embodiments of the present disclosure, but are not intended to limit the scope of other embodiments. The terms of a singular form may include plural forms unless they have a clearly different meaning in the context. Otherwise, all terms used herein may have the same meanings that are generally understood by a person skilled in the art. In general, terms defined in a dictionary should be considered to have the same meanings as the contextual meaning of the related art, and, unless clearly defined herein, should not be understood differently or as having an excessively formal meaning. In any case, even the terms defined in the present specification are not intended to be interpreted as excluding embodiments of the present disclosure.

An electronic device according to various embodiments of the present disclosure may include at least one of a smartphone, a tablet personal computer (PC), a mobile phone, a video telephone, an electronic book reader, a desktop PC, a laptop PC, a netbook computer, a workstation, a server, a personal digital assistant (PDA), a portable multimedia player (PMP), a Motion Picture Experts Group (MPEG-1 or MPEG-2) Audio Layer 3 (MP3) player, a mobile medical device, a camera, or a wearable device. The wearable device may include at least one of an accessory-type device (e.g., a watch, a ring, a bracelet, an anklet, a necklace, glasses, a contact lens, a head-mounted device (HIVID)), a textile- or clothing-integrated-type device (e.g., an electronic apparel), a body-attached-type device (e.g., a skin pad or a tattoo), or a bio-implantable-type device (e.g., an implantable circuit).

In some various embodiments of the present disclosure, an electronic device may be a home appliance. The smart home appliance may include at least one of, for example, a television (TV), a digital video/versatile disc (DVD) player, an audio, a refrigerator, an air conditioner, a cleaner, an oven, a microwave oven, a washing machine, an air cleaner, a set-top box, a home automation control panel, a security control panel, a television (TV) box (e.g., SAMSUNG HOMESYNC™, APPLE TV™, or GOOGLE TV™), a game console (e.g., XBOX™ or PLAYSTATION™), an electronic dictionary, an electronic key, a camcorder, or an electronic picture frame.

In other various embodiments of the present disclosure, an electronic device may include at least one of various medical devices (e.g., various portable medical measurement devices (e.g., a blood glucose measuring device, a heart rate measuring device, a blood pressure measuring device, a body temperature measuring device, or the like), a magnetic resonance angiography (MRA), a magnetic resonance imaging (MM), a computed tomography (CT), a scanner, an ultrasonic device, or the like), a navigation device, a global navigation satellite system (GNSS), an event data recorder (EDR), a flight data recorder (FDR), a vehicle infotainment device, electronic equipment for vessels (e.g., a navigation system, a gyrocompass, or the like), avionics, a security device, a head unit for a vehicle, an industrial or home robot, an automatic teller machine (ATM), a point of sales (POS) device of a store, or an Internet of things (IoT) device (e.g., a light bulb, various sensors, an electric or gas meter, a sprinkler, a fire alarm, a thermostat, a streetlamp, a toaster, exercise equipment, a hot water tank, a heater, a boiler, or the like).

According to various embodiments of the present disclosure, an electronic device may include at least one of a part of furniture or a building/structure, an electronic board, an electronic signature receiving device, a projector, or a measuring instrument (e.g., a water meter, an electricity meter, a gas meter, a wave meter, or the like). An electronic device may be one or more combinations of the above-mentioned devices. An electronic device according to some various embodiments of the present disclosure may be a flexible device. An electronic device according to an embodiment of the present disclosure is not limited to the above-mentioned devices, and may include new electronic devices with the development of new technology.

Hereinafter, an electronic device according to various embodiments of the present disclosure will be described in more detail with reference to the accompanying drawings. The term "user" used herein may refer to a person who uses an electronic device or may refer to a device (e.g., an artificial intelligence electronic device) that uses an electronic device.

FIG. 1 is an exploded perspective view of an electronic device 100 according to various embodiments of the present disclosure.

According to various embodiments, the electronic device 100 may include a housing that defines an external appearance of the electronic device 100, and various electronic components may be mounted inside the housing. Electromagnetic waves may be generated by the electronic components arranged inside the housing. Accordingly, the electronic components of the electronic device 100 may be covered by a shield can or the like such that the electromagnetic waves generated by the electronic components may be shielded.

Referring to FIG. 1, the housing may include a first plate (for example, a front plate), a second plate (for example, a rear plate) that faces an opposite side of the first plate (or that is separated from the first plate), and side members that at least partially surround a space between the first plate and the second plate. For example, the housing may include a front cover 111 that is arranged on the front surface of the electronic device 100 and a rear cover 113 that surrounds the rear surface and the side surfaces of the electronic device 100. The front cover 111 covers at least some of the internal modules (for example, a display 150, a microphone (not illustrated), and a speaker (not illustrated) of the electronic device 100, which are seated in a bracket 130, to physically protect the internal modules from an external impact or the like. According to various embodiments, the front cover 111 may have a size that is the same as or similar to that of the bracket 130, and a bonding material may be applied to at least an area of the front cover 111, which contacts the bracket 130, or a bonding layer may be included in the front cover 111 such that the front cover 111 may be fixed to the bracket 130. In some embodiments, the front cover 111 may be attached to or detached from the bracket 130. For example, the front cover 111 may be fixed to the bracket 130 at a point at which the front cover 111 contacts the bracket 130 through a screw member or the like.

In various embodiments, the front cover 111 may include a transparent material (or a transparent area) in an area thereof. According to an embodiment, the front cover 111 may include a glass window formed of glass in an area thereof. Accordingly, a screen that is output through the display 150 arranged under the front cover 111 may be displayed to the outside through the transparent area of the front cover 111.

The rear cover 113 may be arranged under the bracket 130. The rear cover 113 may surround the internal modules arranged between the front cover 111 and the rear cover 113, a bracket 130, a printed circuit board 170, and the like from the rear side and the lateral sides of the electronic device 100 to protect them from an external impact or the like. According to various embodiments, a bonding material may be applied to an area of the rear cover 113, which the bracket 130, the printed circuit board 170, or the like contacts, or a bonding layer may be included in the rear cover 113 such that the bracket 130, the printed circuit board 170, or the like may be fixed to the rear cover 113. In some embodiments, the rear cover 113 may be attached to or detached from the bracket 130. For example, the rear cover 113 may be fixed to the bracket 130 at a point at which the rear cover 113 contacts the bracket 130 through a protrusion, a stopper member, a hook member or the like.

According to various embodiments, the rear cover 113 may include at least one opening in an area thereof. In an embodiment, the rear cover 113 may be arranged on the printed circuit board 170 while having an opening at a central upper end area thereof, or may allow a camera module or the like, which is connected to the printed circuit board 170 to be exposed to the outside. The rear cover 113 may have a microphone hole or a speaker hole at a location corresponding to the microphone or the speaker that is arranged on the printed circuit board 170 or connected to the printed circuit board 170 such that sounds may be introduced into or discharged from the microphone or the speaker. In some embodiments, the rear cover 113 may further include an input/output terminal hole to which an external input/output terminal may be connected.

According to various embodiments, the electronic device 100 may include the bracket 130 arranged inside the housing, the internal modules (for example, the display 150, the microphone, and the speaker), and the printed circuit board 170. According to an embodiment, the bracket 130 may include an insulating material, and a bonding material may be applied to an area of the bracket 130 or a bonding layer may be included in the bracket 130 such that the internal modules, the printed circuit board 170, and the like may be fixed to the bracket 130.

According to various embodiments, the bracket 130 may include at least one opening. According to an embodiment, the internal module may be connected to the printed circuit board 170 through the at least one opening formed in the bracket 130. According to various embodiments, the bracket 130 may have one opening at a central area other than an peripheral area thereof, and in some embodiments, the number, the form, or the locations of the openings may be differently determined according to the number, the form, or the locations of the modules, which are connected to the printed circuit board 170, of the internal modules.

According to various embodiments, the display 150 may be on the bracket 130 to display various contents (for example, a text, an image, a video, an icon, and a symbol). The display 150 may include a touch screen and, for example, may receive a touch, a gesture, a proximity, or a hovering input using an electronic pen or the body of the user. Although not illustrated, the electronic device 100 may include various internal modules. For example, the electronic device 100 may include a microphone or a speaker. The microphone or the speaker is an audio input/output device, and may process sounds that are input or output.

According to various embodiments, the printed circuit board 170 may be arranged under the bracket 130, and various electronic components 171 may be mounted on the printed circuit board 170. For example, at least one electronic element and circuit lines may be mounted on the printed circuit board 170, and at least some of them may be electrically connected to each other. The electronic components, for example, may include a processor, a memory, and a communication module.

The processor may include one or more of a central processing unit (CPU), an application processor (AP), or a communication processor (CP). The processor, for example, may execute operations or data processing related to the control and/or communication of at least one other component of the electronic device 100. The processor, for example, may control a plurality of hardware or software components connected to the processor by driving an operating system or an application program and perform a variety of data processing and calculations. According to an embodiment, the processor may be implemented by a System on Chip (SoC).

The memory may include a volatile and/or nonvolatile memory. For example, the memory may store a command or data related to at least one other element of the electronic device 100. According to an embodiment, the memory may store software and/or a program. The program, for example, may include a kernel, middleware, an application programming interface (API), and/or an application program (or "an application"). At least some of the kernel, the middleware, or the API may be referred to as an operating system (OS).

The communication module, for example, may set a communication between an electronic device 100 and an external device. For example, the communication module may be connected to a network through a wireless or wired communication to communicate with the external device.

According to various embodiments, the electronic device 100 may include a shield can 300 that covers the least one electronic component 171. At least one shield can 300 may be arranged on the printed circuit board 170, and may shield electromagnetic waves generated by the electronic component 171. According to an embodiment, the shield can 300 may cover an outside of the electronic component 171 in a form of a can or a box by using a synthetic resin to which a metal plate or a conductive metal is added to shield electromagnetic waves generated by the electronic component 171. According to an embodiment, the shield can 300 may be provided in a box form, a portion (for example, a lower side) of which is opened, to cover the electronic component 171. The structure of the shield can 300 will be described in detail through the following embodiments.

Although some configurations of the electronic device 100 are illustrated in the drawings, the electronic device 100 may further include at least one element, in addition to the above-mentioned elements. For example, the electronic device 100 may further include a battery and a battery cover that surrounds the battery under the rear cover 113. In this case, the rear cover 113 may include a battery coupler such that the battery may be coupled to the rear cover 113, and the battery may be electrically connected to the printed circuit board 170 through the battery coupler.

Figure 2A:
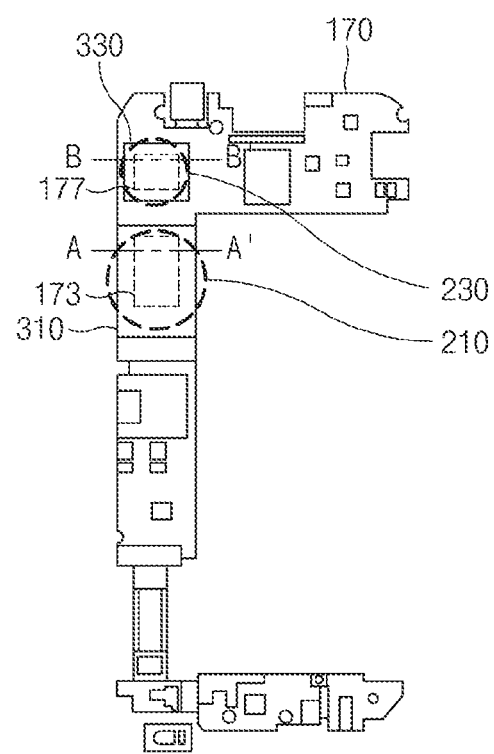
FIG. 2A illustrates a front view of the printed circuit board according to various embodiments of the present disclosure.
Figure 2B:
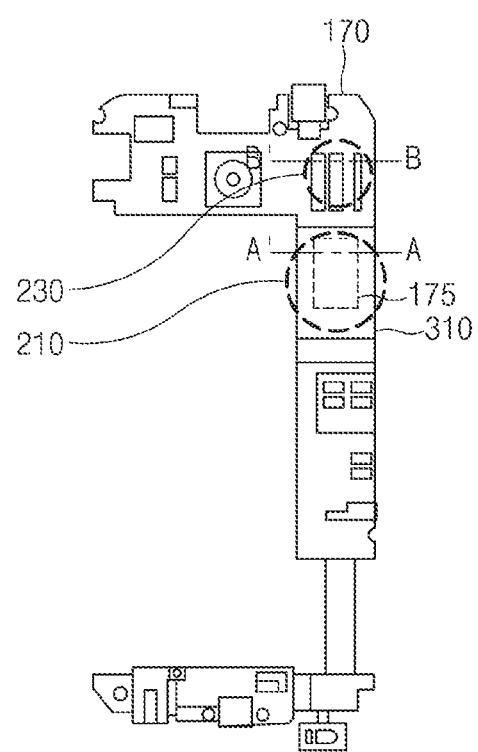
FIG. 2B illustrates a rear view of the printed circuit board according to various embodiments of the present disclosure.

FIG. 2A illustrates a front view of the printed circuit board 170, and FIG. 2B illustrates a rear view of the printed circuit board 170.

Referring to FIGS. 2A and 2B, various electronic components may be arranged on the printed circuit board 170. For example, a processor, a memory, a communication module, and a camera module may be arranged on the printed circuit board 170. According to various embodiments, various electronic components may be arranged on the upper and lower surfaces (or the front and rear surfaces) of the printed circuit board 170. As illustrated in the drawings, a first electronic component 173 and a third electronic component 177 may be arranged on the upper surface (or the front surface or the first surface) of the printed circuit board 170, and a second electronic component 175 may be arranged on the lower surface (or the rear surface or the second surface) of the printed circuit board 170. According to an embodiment, the first electronic component 173 and the second electronic component 175 may be arranged on the upper and lower surfaces of the printed circuit board 170 at corresponding locations. In the following embodiments, the first to third electronic component 173, 175, and 177 will be described for convenience of description.

The electronic components arranged on the printed circuit board 170 may generate electromagnetic waves. Accordingly, at least one shield can (for example, the shield can 300 of FIG. 1) that may shield electromagnetic waves may be arranged on the printed circuit board 170 to cover at least one electronic component. The drawings illustrate that a first shield can 310 that covers the first electronic component 173 and the second electronic component 175 to provide a first shielding area 210 and a second shield can 330 that covers the third electronic component 177 to provide a second shielding area 230 may be arranged on the printed circuit board 170.

According to various embodiments, both of the first shield can 310 and the second shield can 330 have the same function of shielding electromagnetic waves, but the structures thereof may be different. For example, although the first shield can 310 may cover all the electronic components (for example, the first electronic component 173 and the second electronic component 175) arranged on the upper and lower surfaces of the printed circuit board 170 to provide the first shielding area 210, the second shied can 330 may cover the at least one electronic component (for example, the third electronic component 177) arranged on one surface (for example, the front surface) of the printed circuit board 170 to provide the second shielding area 230.

According to various embodiments, the shield cans may surround the electronic components arranged on at least one surface of the printed circuit board 170 and the side surface of the printed circuit board 170. To achieve this, the printed circuit board 170 may require a space through which the shield cans may extend from one surface (for example, the upper surface (or the front surface) to an opposite surface (for example, the lower surface (or the rear surface) of the printed circuit board 170. According to various embodiments, the printed circuit board 170 may provide an opening in an area around the electronic components such that the shield cans may extend from one surface to an opposite surface of the printed circuit board 170 through the opening. According to an embodiment, at least one via hole (for example, a shielding via hole) may be formed in the printed circuit board 170 to be used as the opening. According to various embodiments, a shielding area may be provided in a form, such as the first shield can 310, which surrounds opposite edges of the printed circuit board 170 in an area (for example, a central area) in which the width of the printed circuit board 170 is relatively narrow. Further, the opposite edges of the printed circuit board 170 may be cut away by a specific size (for example, 0.2 mm) such that a space through which the shield cans may extend from one surface to an opposite surface of the printed circuit board 170.

According to various embodiments, the form, the size, and the locations of the shield cans may be different according to the form, the size, and the locations of the at least one electronic component, to which a shielding area is to be provided. For example, the form and the size of the shield cans also may be determined to correspond to the form and the size of the electronic component. Further, the locations of the shield cans may be determined to correspond to the location at which the electronic component is arranged. According to various embodiments, the printed circuit board 170 may be integrally provided as illustrated, and a plurality of separate printed circuit boards may be electrically connected to each other.

Figure 3A:
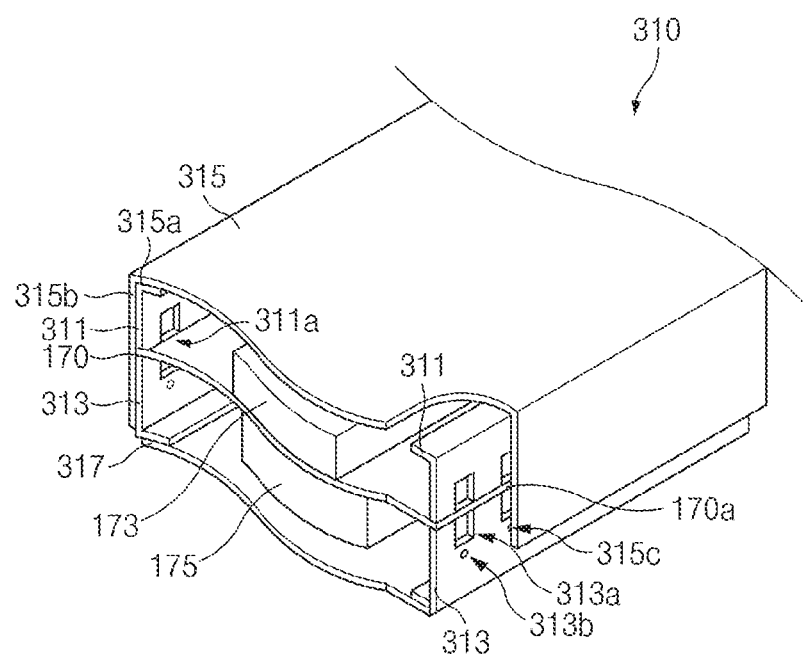
FIG. 3A illustrates a part of the first shielding area, to which the electronic components arranged on the upper and lower surfaces of the printed circuit board of FIGS. 2A and 2B are applied, is cut away according to various embodiments of the present disclosure.
Figure 3B:
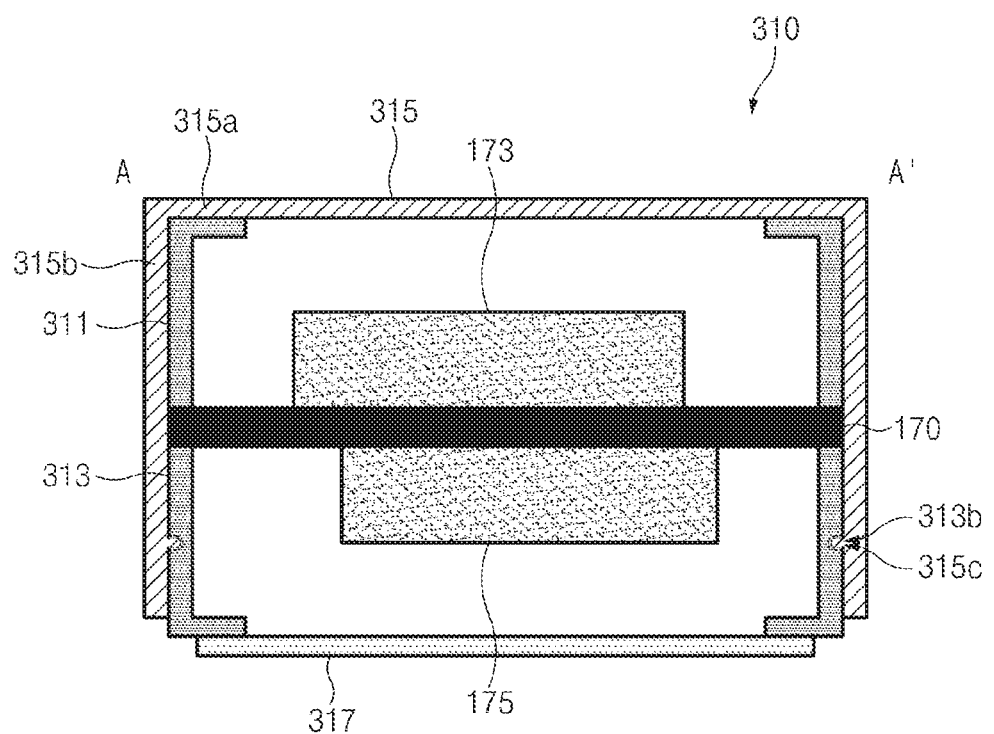
FIG. 3B illustrates an example of a section of the first shielding area of FIG. 2B taken along line A-A' according to various embodiments of the present disclosure.
Figure 3C:
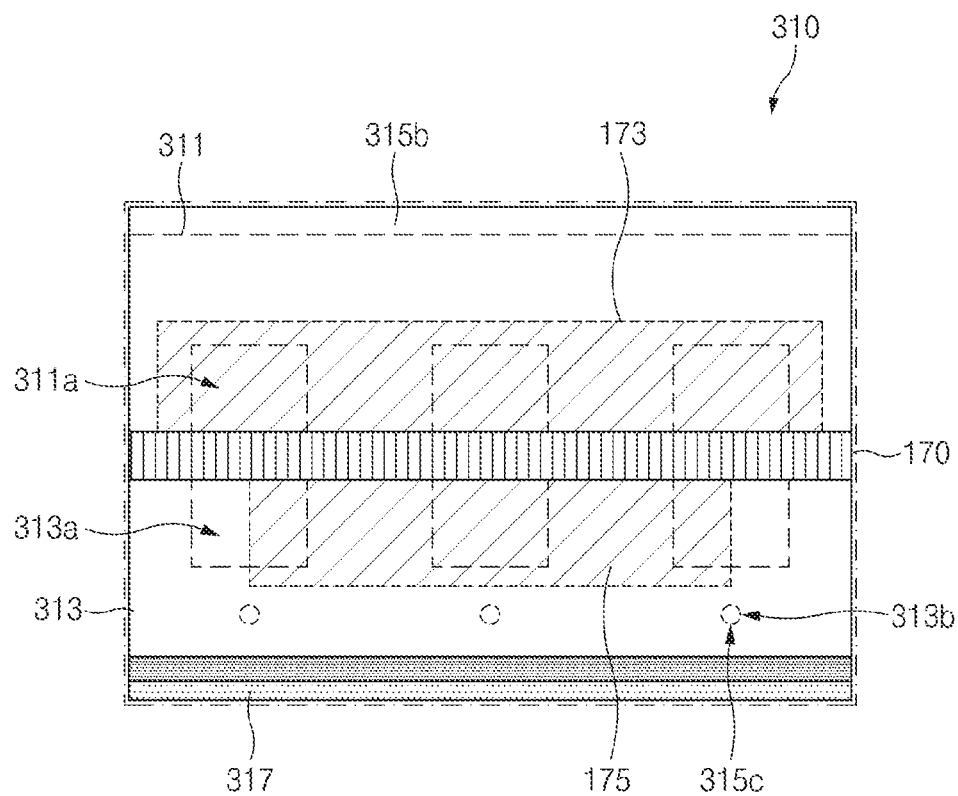
FIG. 3C illustrates an example of a side surface of the part of the first shielding area of FIGS. 2A and 2B according to various embodiments of the present disclosure.

FIG. 3A is a perspective view illustrating that a part of the first shielding area 210, to which the electronic components arranged on the upper and lower surfaces of the printed circuit board 170 of FIGS. 2A and 2B are applied, is cut away according to an embodiment, FIG. 3B is a view illustrating an example of a section of the first shielding area 210 of FIG. 2B taken along line A-A', and FIG. 3C is a view illustrating an example of a side surface of the part of the first shielding area 210 of FIGS. 2A and 2B.

According to an embodiment, referring to FIGS. 3A to 3C, the first electronic component 173 and the second electronic component 175 may be arranged on the upper and lower surfaces of the printed circuit board 170, respectively. According to various embodiments, the first shield can 310 may be provided to shield the electromagnetic waves generated by the first electronic component 173, the second electronic component 175, and the side surfaces 170*a* of the printed circuit board 170.

The first shield can 310 may include a first shield frame 311 (or a first support member), a second shield frame 313 (or a second support member), a shield cover 315, and a shielding layer 317. The first shield frame 311 may be arranged on one surface (or the upper surface) of the printed circuit board 170. The first shield frame 311 may be arranged adjacent to the left and right surfaces of the first electronic component 173. The first shield frame 311 may have a width that is the same as or similar to the transverse length of the side surfaces of the first electronic component 173, and may have a height that is larger than the vertical length of the side surfaces of the first electronic component 173. According to various embodiments, the first shield frame 311 may extend from one surface (for example, the upper surface) of the printed circuit board 170 with a specific thickness by a specific height (or defines a side wall), and may be bent towards the first electronic component 173 (for example, inwards) at a height that is the same as or similar to the vertical length of the side surfaces of the first electronic component 173 to extend parallel to the upper surface of the first electronic component 173 by a specific length. For example, the first shield frame 311 may have a side wall with a specific height and a specific thickness on one surface (for example, the upper surface) of the printed circuit board 170 and an area of an upper edge thereof may be bent. According to various embodiments, the bent area of the first shield frame 311, that is, an area of the upper edge of the first shield frame 311 may be used as an area that supports the shield cover 315.

According to various embodiments, the first shield frame 311 may include one or more openings 311*a* that are formed at a lower end of the side wall of the first shield frame 311, which is coupled to the printed circuit board 170, to be spaced apart from each other in the widthwise direction thereof at a specific distance. Although the drawing illustrates a state in which the first shield frame 311 is arranged adjacent only to the left and right surfaces of the first electronic component 173, the first shield frame 311 may be arranged adjacent to at least one of the upper and lower surfaces of the electronic component 173.

The second shield frame 313 may be arranged on an opposite surface (or the lower surface) of the printed circuit board 170. The second shield frame 313 may be arranged adjacent to the second electronic component 175. The second shield frame 313 may be the same as or similar to the first shield frame 311. In the following description of the second shield frame 313, a form that is similar to the first shield frame 311 will be omitted.

According to various embodiments, the second shield frame 313 may include one or more openings 313a that are formed at a lower end of the side wall of the second shield frame 313, which is coupled to the printed circuit board 170, to be spaced apart from each other in the widthwise direction thereof at a specific distance. According to various embodiments, the second shield frame 313 may include at least one coupling hole 313b (or a first connecting member, or a first coupling member) in an area (for example, an area that is adjacent to an opening 313a) of a side wall thereof. The at least one coupling hole 313b may have a specific width and a specific depth such that at least one coupling protrusion 315c (or a second connecting member, or a second coupling member) formed in the shield cover 315 may be coupled to the at least one coupling hole 313b.

The shield cover 315 may include a cover part 315a (or a first conductive sheet) that covers an upper side of the first electronic component 173 arranged on one surface of the printed circuit board 170, a side part 315b (for a second conductive sheet) that is bent downwards from a part of an edge of the cover part 315a to cover at least a portion of a side wall of the first shield frame 311, a side surface 170a of the printed circuit board 170, and a side wall of the second shield frame 313, and at least one coupling protrusion 315c that is coupled to at least one coupling hole 313b formed on a side wall of the second shield frame 313.

According to various embodiments, the cover part 315a of the shield cover 315 may be seated and supported on an area that is formed at an upper end of the side wall of the first shield frame 311, that is, an upper area of the first shield frame 311 formed in parallel to the upper surface of the first electronic component 173. According to various embodiments, the side part 315b of the shield cover 315 may extend from the cover part 315a, and may cover the coupling hole 313b formed on the side wall of the second shield frame 313.

Although the drawing illustrates that the side part 315b of the shield cover 315 has a plate form having a specific area and a specific thickness to cover the opening 311a formed on the side wall of the first shield frame 311, the side surface 170a of the printed circuit board 170, and the opening formed in the side wall of the second shield frame 313, the present disclosure is not limited thereto. In some embodiments, the remaining area of the side part 315b of the shield cover 315 other than the opening 311a formed on the side wall of the first shield frame 311, the side surface 170a of the printed circuit board 170, and the opening formed in the side wall of the second shield frame 313 may or may not include an opening.

According to various embodiments, the coupling protrusions 315c formed on the side part 315b of the shield cover 315 may be arranged to correspond to the coupling holes 313b formed in the side wall of the second shield frame 313, and may be inserted into and coupled to the coupling holes 313b. Accordingly, the shield cover 313 may be fixed to cover some of an upper portion of the first electronic component 173, the first shield frame 311, the side surface 170a of the printed circuit board 170, and a portion of the second shield frame 313. Although the drawing illustrates that the coupling holes 313b are formed in the side wall of the second shield frame 313 and the coupling protrusions 315c are formed in the side part 315b of the shield frame 315 at locations corresponding to the coupling holes 313b, the present disclosure is not limited thereto. According to various embodiments, the coupling holes 313b may be formed in the side wall of the first shield frame 311, and in some embodiments, the coupling holes 313b may be formed in a bent area formed at an upper end of the side wall of the second shield frame 313, that is, an upper area of the second shield area 313 formed in parallel to the upper surface of the second electronic component 175.

The shielding layer 317 (or a third conductive sheet) may cover an upper side of the second electronic component 175 arranged on an opposite surface (that is, the lower surface) of the printed circuit board 170. According to various embodiments, the shielding layer 317 may be seated and supported on a bent area that is formed at an upper end of the side wall of the second shield frame 313, that is, an upper area of the second shield frame 313 formed in parallel to the upper surface of the second electronic component 175. According to various embodiments, the shielding layer 317 may be attached to and detached from a bent area that is formed at an upper end of the side wall of the second shield frame 313. The shielding layer 317, for example, may be formed of a material, such as a shield tape, which may interrupt electromagnetic waves. According to various embodiments, the shielding layer 317 may be formed of a material that is softer than the shield cover 315.

According to various embodiments, the first shield frame 311 may be arranged adjacent to the upper or lower surfaces of the first electronic component 173. In this case, an opening may not be formed on the upper or lower portion of the first shield frame 311. Further, at least one opening may be formed on the upper or lower portion of the first shield frame 311, and the shield cover 315 may be coupled to the upper or lower portion of the first shield frame 311 to cover the opening. In some embodiments, at least one opening may be formed on the upper or lower portion of the first shield frame 311, and the shield cover 315 may cover at least a portion of the upper or lower portion of the first shield frame 311 to cover the opening and may extend to the rear side of the printed circuit board 170 through the opening (for example, the via hole) formed in the printed circuit board 170.

According to various embodiments, the second shield frame 313 may be arranged adjacent to the upper or lower surfaces of the second electronic component 175. In this case, an opening may not be formed on the upper or lower portion of the second shield frame 313. Further, at least one opening may be formed on the upper or lower portion of the second shield frame 313, and the shield cover 315 that extends from the upper surface of the printed circuit board 170 to the lower side of the printed circuit board 170 through the opening (for example, the via hole) formed in the printed circuit board 170 may be coupled to the upper or lower portion of the second shield frame 313 to cover the opening.

According to various embodiments, the structure of the first shield can 310 is not limited thereto. The first shield can 310 may be provided in various forms that may provide the first shielding area 210 to the electronic components arranged on the upper and lower surfaces of the printed circuit board 170. In the following embodiments, another structure of the first shield can 310 that provides the first shielding area 210 will be described. Further, in the following embodiments, the same or similar configurations will be omitted.

According to various embodiments, the method for forming a first shielding area 210 through the first shield can 310 may include an operation of mounting at least one electronic component, for example, a first electronic component 173 and a second electronic component 175 on the upper and lower surfaces of the printed circuit board 170 through an SMD process, an operation of coupling a first shield frame 311 and a second shield frame 313 to the upper and lower surfaces of the printed circuit board 170 through an SMD process, an operation of covering at least some of an upper portion of the first electronic component 173, the first shield frame 311, side surfaces of the printed circuit board 170, and the second shield frame 313 with a shield cover 315, an operation of coupling a coupling protrusion 315c formed in the shield cover 315 to a coupling hole 313b formed in the second shield frame 313, and an operation of attaching a shielding layer 317 to an upper end of the second shield frame 313 such that the shielding layer 317 covers an upper side of the second electronic component 175.

Figure 4A:
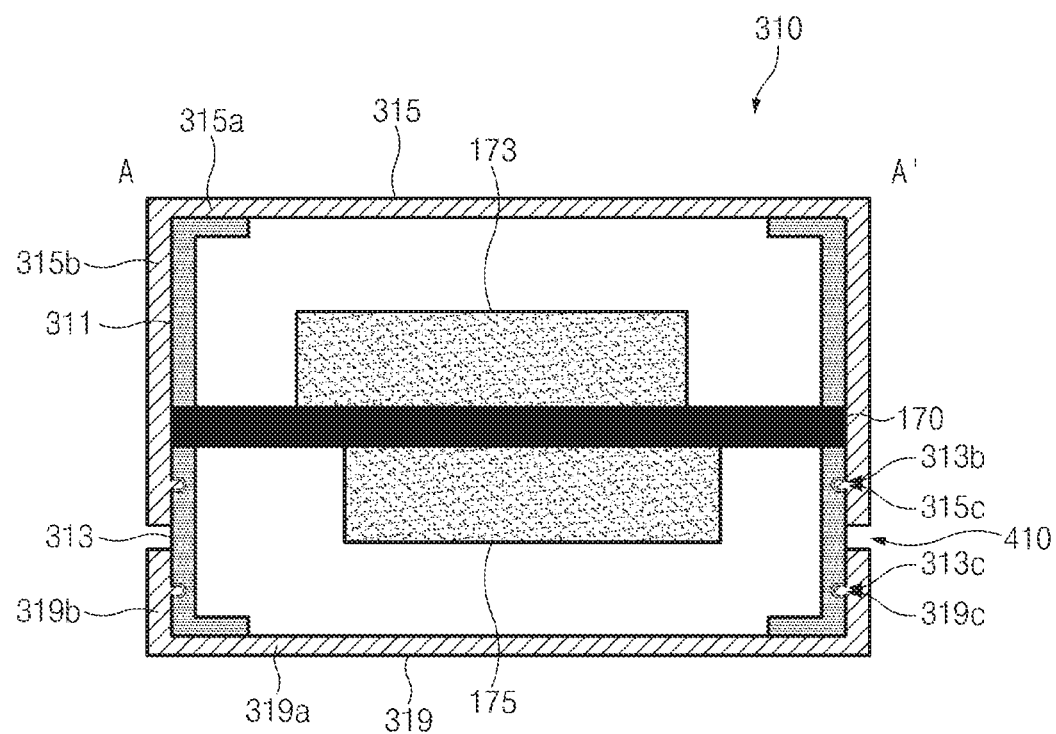
FIG. 4A illustrates another example of a section of the first shielding area of FIGS. 2A and 2B taken along line A-A' according to various embodiments of the present disclosure.
Figure 4B:
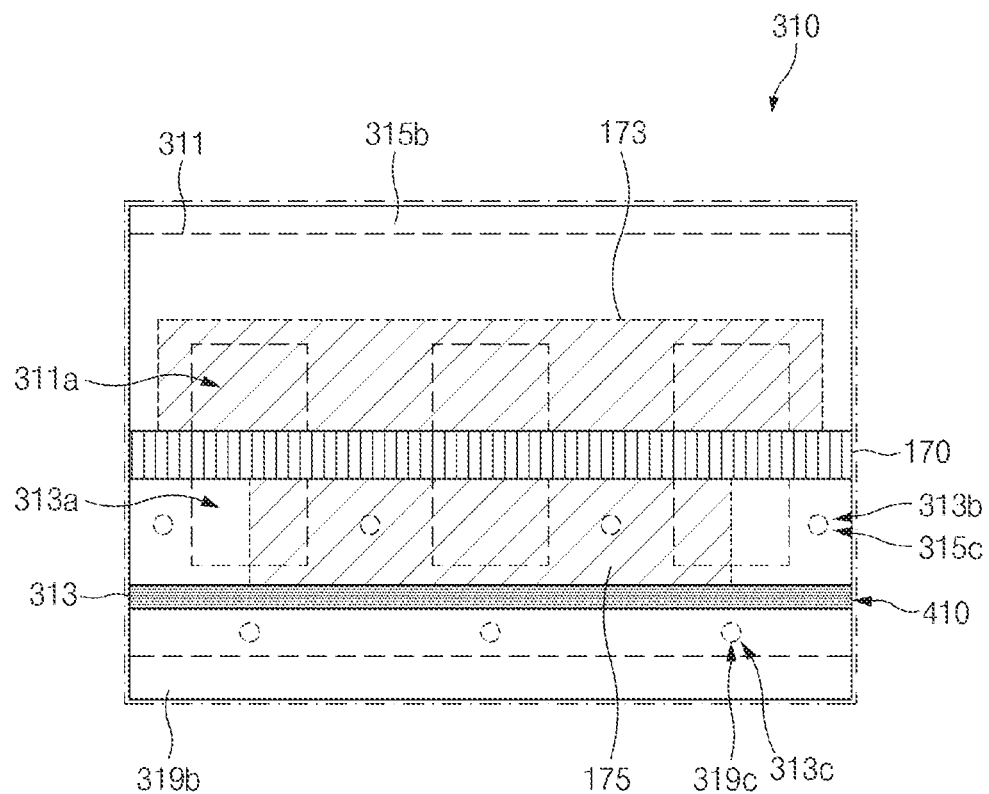
FIG. 4B illustrates another example of a side surface of a part of the first shielding area of FIGS. 2A and 2B according to various embodiments of the present disclosure.

FIG. 4A is a view illustrating another example of a section of the first shielding area 210 of FIGS. 2A and 2B taken along line A-A', and FIG. 4B is a view illustrating another example of a side surface of a part of the first shielding area 210 of FIGS. 2A and 2B.

Referring to FIGS. 4A and 4B, the first shield can 310 may include a second shield cover 319 instead of the shielding layer 317 of FIGS. 3A to 3C. In this case, the second shield cover 319 may cover an upper side of the second electronic component 175 arranged on one surface (for example, the lower surface) of the printed circuit board 170 to interrupt electromagnetic waves. The first shield can 310 may provide a first shielding area 210 having an improved shielding function, by using a second shield cover 319 of a material that is the same as or similar to that of the shield cover 315 instead of using the shielding layer 317.

The second shield cover 319 may include a cover part 319a that covers an upper side of the second electronic component 175 arranged on one surface (for example, the lower surface) of the printed circuit board 170, a side part 319b that is bent downwards from a portion of an edge of the cover part 319a to cover at least a portion of a side wall of the second shield frame 313, and at least one coupling protrusion 319c that is formed in an area of the side part 319b to be coupled to at least one coupling hole 313c formed in a side wall of second shield frame 313.

According to various embodiments, the cover part 319a of the second shield cover 319 may be seated and supported on a bent area formed at an upper end of the side wall of the second shield frame 313. Further, the side part 319b of the second shield cover 319 may extend from the cover part 319a to cover the coupling whole 313c formed in the side wall of the second shield frame 313.

According to various embodiments, the at least one coupling protrusion 319c formed on the side part 319b of the second shield cover 319 may be arranged to correspond to the at least one coupling hole 313c formed in an area (for example, an upper end area of the side wall) of the side wall of the second shield frame 313, and may be inserted into and coupled to the coupling hole 313c. Accordingly, the second shield cover 319 may be fixed to cover an upper portion of the second electronic component 175 and a portion of the second shield frame 313. Although the drawing illustrates that the coupling hole 313c is formed at an upper end area of the side wall of the second shield frame 313 and the coupling protrusion 319c is arranged at a corresponding location and is formed on the side part 319b of the second shield cover 319, the present disclosure is not limited thereto. According to various embodiments, although the coupling hole 313c may be formed in a bent area formed at an upper end of the side wall of the second shield frame 313, that is, in an upper area of the second shield frame 313 formed in parallel to the upper surface of the second electronic component 175, the coupling protrusion 319c may be formed at a corresponding location, that is, in the cover part 319a of the second shield cover 319.

According to various embodiments, In order to secure a spacing distance 410 between the shield covers, the shield cover 315 may be formed to cover the second shield frame 313 having an area that is smaller than that of the side part 315b of the shield cover 315 of FIGS. 3A to 3C, by arranging the second shield cover 319 such that the second shield cover 319 covers a portion of the second shield frame 313. Accordingly, the coupling hole 313b into which the at least one coupling protrusion 315c formed on the side part 315b of the shield cover 315 may be inserted to be coupled to the at least one coupling protrusion 315c may be formed in a lower area of the second shield frame 313. Although the drawing illustrates that the coupling hole 313b, to which the coupling protrusion 315c formed on the side part 315b of the shield cover 315 is coupled, is arranged between the openings 313a formed in the second shield frame 313, the present disclosure is not limited thereto. According to various embodiments, the coupling hole 313b may be formed between the opening 313a and the coupling hole 313c. Further, the coupling hole 313b may be formed in the side wall of the first shield frame 311.

According to various embodiments, the method for forming a first shielding area 210 through the first shield can 310 may include an operation of mounting at least one electronic component, for example, a first electronic component 173 and a second electronic component 175 on the upper and lower surfaces of the printed circuit board 170 through an SMD process, an operation of coupling a first shield frame 311 and a second shield frame 313 to the upper and lower surfaces of the printed circuit board 170 through an SMD process, an operation of covering at least some of an upper portion of the first electronic component 173, the first shield frame 311, side surfaces of the printed circuit board 170, and the second shield frame 313 with a shield cover 315, an operation of coupling a coupling protrusion 315c formed in the shield cover 315 to a coupling hole 313b formed in the second shield frame 313, an operation of covering an upper portion of the second electronic component 175 and a portion of the second shield frame 313 with a second shield cover 319, and an operation of coupling a coupling protrusion 319c formed in the second shield cover 319 to a coupling hole 313c formed in the second shield frame 313.

Figure 5A:
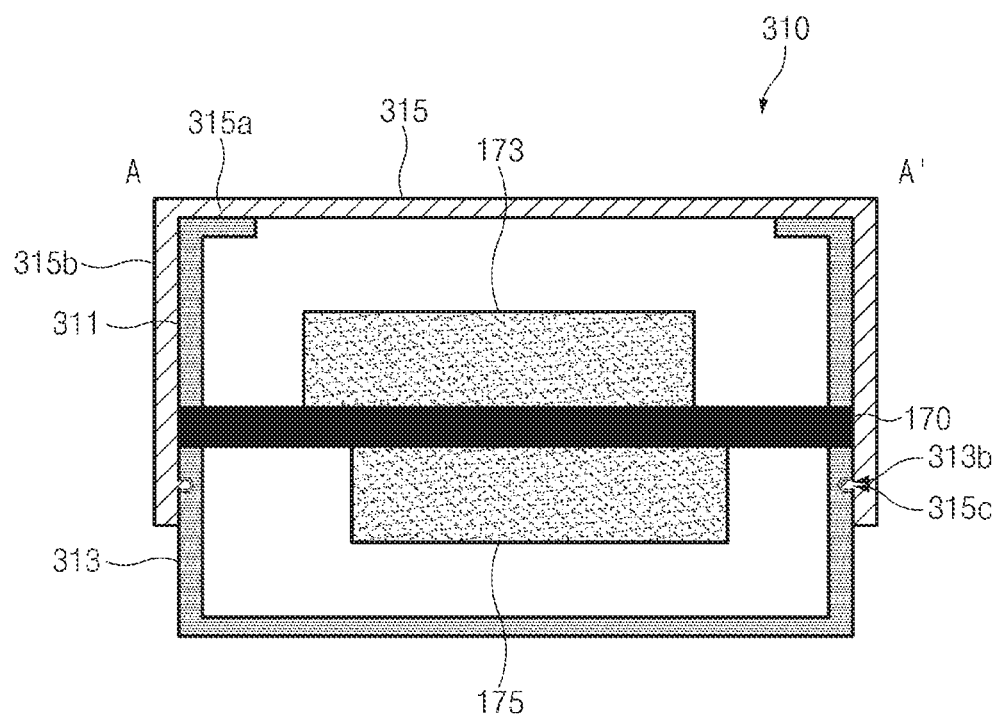
FIG. 5A illustrates another example of a section of the first shielding area of FIGS. 2A and 2B taken along line A-A' according to various embodiments of the present disclosure.
Figure 5B:
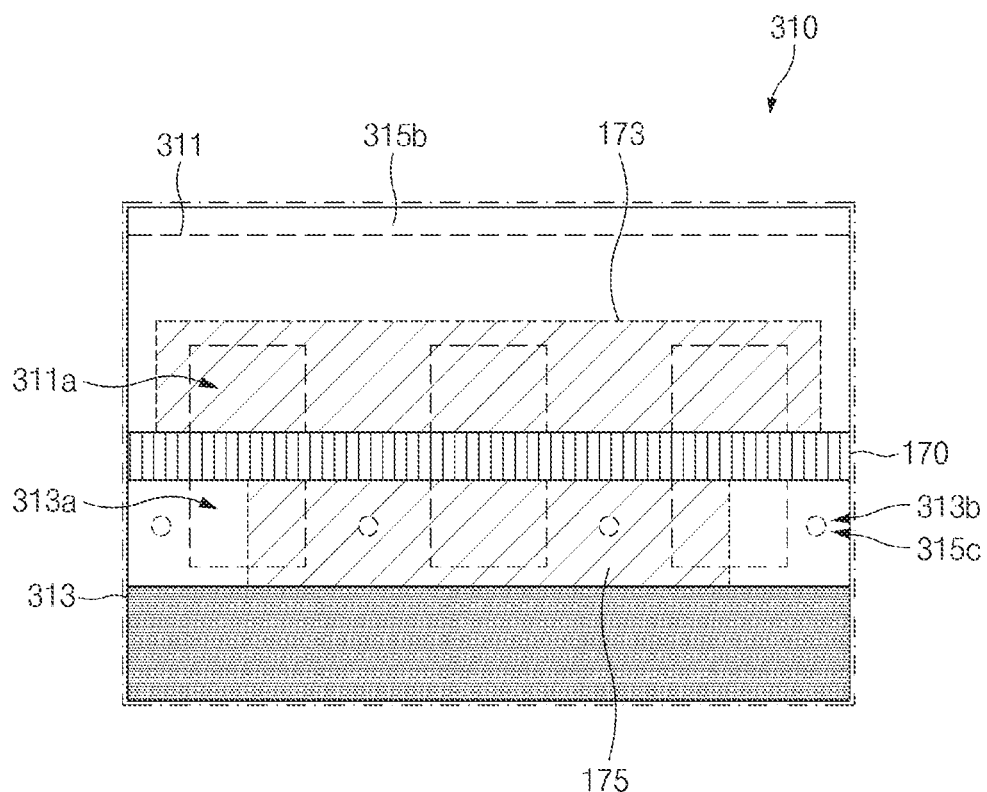
FIG. 5B illustrates another example of a side surface of a part of the first shielding area of FIGS. 2A and 2B according to various embodiments of the present disclosure.

FIG. 5A is a view illustrating another example of a section of the first shielding area 210 of FIGS. 2A and 2B taken along line A-A', and FIG. 5B is a view illustrating another example of a side surface of a part of the first shielding area 210 of FIGS. 2A and 2B.

Referring to FIGS. 5A and 5B, the first shield can 310 may cover an upper side of the second electronic component 175 arranged on one surface (for example, the lower surface) of the printed circuit board 170 to interrupt electromagnetic waves by using the second shield frame 313 instead of using the shielding layer 317 of FIGS. 3A to 3C and the second shield cover 319 of FIGS. 4A and 4B.

The second frame 313 may be arranged on one surface (for example, the lower surface) of the printed circuit board 170, and may be arranged adjacent to the left and right surfaces of the second electronic component 175. The second shield frame 313 may have a width that is the same as or similar to the transverse length of the side surfaces of the second electronic component 175, and may have a height that is larger than the vertical length of the side surfaces of the second electronic component 175. According to various embodiments, the second shield frame 313 may extend from one surface (for example, the upper surface) of the printed circuit board 170 with a specific thickness by a specific height (or defines a side wall), and may be bent towards the second electronic component 175 (for example, inwards) at a height that is the same as or similar to the vertical length of the side surfaces of the second electronic component 175. Further, the second shield frame 313 may extend from corners of the opposite side walls thereof and may cover an upper side of the second electronic component 175. For example, the second shield frame 313 may be bent from portions of opposite edges thereof towards the second electronic component 175 and may extend from the bent areas by a length, and the extending ends of the second shield frame 313 may be coupled to each other to be integrally formed.

According to various embodiments, the shield cover 315 may cover some of an upper portion of the first electronic component 173, the first shield frame 311, the side surface 170*a* of the printed circuit board 170, and a portion of the second shield frame 313. According to an embodiment, the side part 315*b* of the shield cover 315 may be formed to cover the openings 313*a* and the coupling holes 313*b* formed in the side walls of the second shied frame 313. Although the drawing illustrates that the coupling hole 313*b* is formed between the openings 313*a* formed in the side walls of the second shield frame 313, the present disclosure is not limited thereto. According to various embodiments, the coupling holes 313*b* may be formed on the upper side of the openings 313*a*, and in this case, the shield cover 315 may be formed in an area in which the coupling holes 313*b* is formed, that is, to cover an upper area of the second shield frame 313. In some embodiments, the coupling hole 313*b* may be formed in the side wall of the first shield frame 311.

According to various embodiments, the method for forming a first shielding area 210 through the first shield can 310 may include an operation of mounting at least one electronic component, for example, a first electronic component 173 and a second electronic component 175 on the upper and lower surfaces of the printed circuit board 170 through an SMD process, an operation of coupling a first shield frame 311 and a second shield frame 313 to the upper and lower surfaces of the printed circuit board 170, respectively, through an SMD process, an operation of covering an upper portion of the first electronic component 173, a first shield frame 311, a side surface of the printed circuit board 170, and at least a portion of the second shield frame 313 with a shield cover 315, and coupling a coupling protrusion 315*c* formed in the shield cover 315 to the coupling hole 313*b* formed in the second shield frame 313.

Figure 6A:
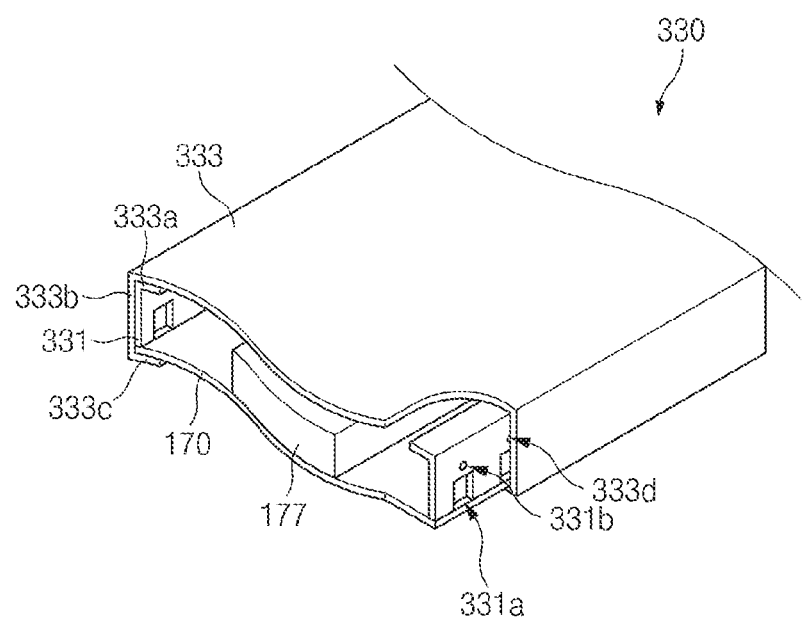
FIG. 6A illustrates a partially cutaway perspective view of the second shielding area applied to the electronic components arranged on one surface of the printed circuit board of FIGS. 2A and 2B according to various embodiments of the present disclosure.
Figure 6B:
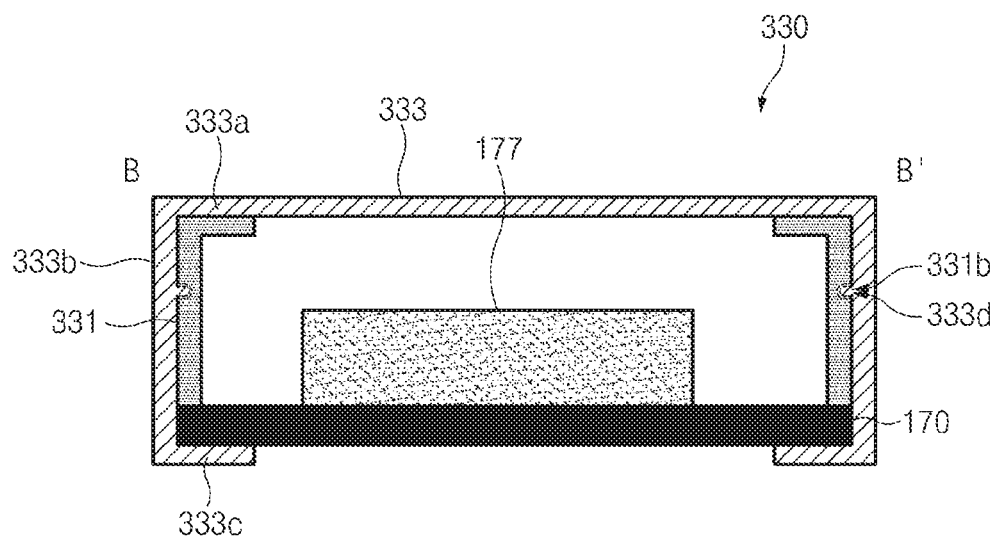
FIG. 6B illustrates a sectional view of the second shielding area of FIGS. 2A and 2B taken along line B-B' according to various embodiments of the present disclosure.
Figure 6C:
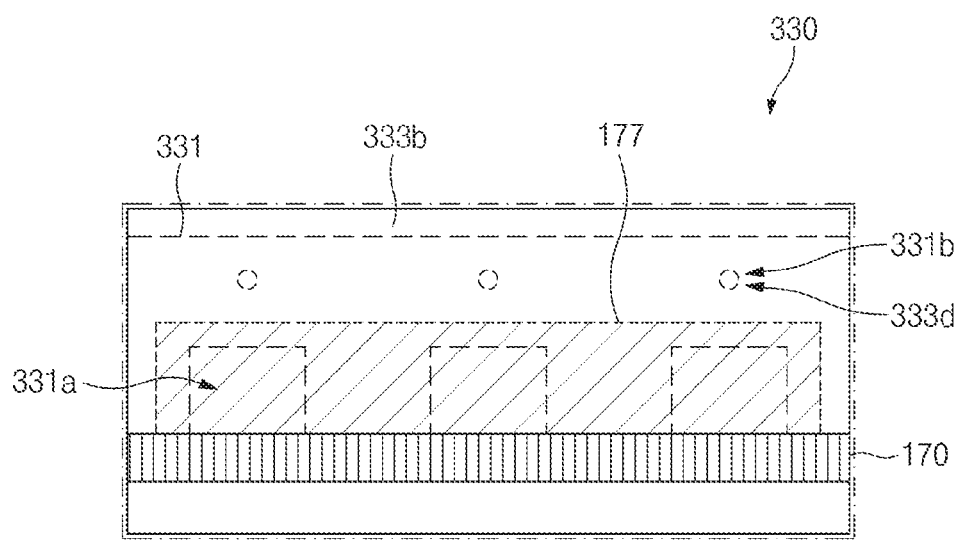
FIG. 6C illustrates a side view of a part of the second shielding area of FIGS. 2A and 2B according to various embodiments of the present disclosure.

FIG. 6A is a partially cutaway perspective view of the second shielding area 230 applied to the electronic components arranged on one surface of the printed circuit board 170 of FIGS. 2A and 2B, FIG. 6B is a sectional view of the second shielding area 230 of FIGS. 2A and 2B taken along line B-B', and FIG. 6C is a side view of a part of the second shielding area 230 of FIGS. 2A and 2B.

Referring to FIGS. 6A to 6C, a third electronic component 177 may be arranged on one surface (for example, the upper surface) of the printed circuit board 170. According to various embodiments, a second shield can 330 may be provided to shield electromagnetic waves generated by the third electronic component 177 and the side surfaces of the printed circuit board 170. In some embodiments, a fourth electronic component may be arranged on an opposite surface (for example, the lower surface) of the printed circuit board 170. However, a second shielding area 230 may be provided only for at least one electronic component arranged on one surface of the printed circuit board 170.

The second shield can 330 may include a shield frame 331 and a shield cover 333. The shield frame 331 may be arranged on one surface (or the upper surface) of the printed circuit board 170. The shield frame 331 may be arranged adjacent to the side surfaces of the third electronic component 177. According to various embodiments, the shield frame 331 may have a width that is the same as or similar to the transverse length of the side surfaces of the third electronic component 177, and may have a height that is larger than the vertical length of the side surfaces of the third electronic component 177. According to various embodiments, the shield frame 331 may extend from one surface (for example, the upper surface) of the printed circuit board 170 with a specific thickness by a specific height (or defines a side wall) at a height that is the same as or similar to the vertical length of the side surfaces of the third electronic component 177 to extend parallel to the upper surface of the third electronic component 177 by a specific length. According to various embodiments, the bent area of the shield frame 331, that is, an area of the upper edge of the shield frame 331 may be used as an area that supports the shield cover 333.

According to various embodiments, the shield frame 331 may include one or more openings 331*a* that are formed at a lower end of the side wall of the shield frame 331, which is coupled to the printed circuit board 170, to be spaced apart from each other in the widthwise direction thereof at a specific distance. According to various embodiments, at least one coupling hole 331*b* may be formed in a side wall of the shield frame 331. Although the drawing illustrates that the coupling hole 331*b* is formed on the upper side of the opening 331*a*, the present disclosure is not limited thereto. In some embodiments, the coupling hole 331*b* may be formed between the openings 331*a*. According to various embodiments, the coupling hole 331*b* may not formed in an area of the shield frame 331 but may be formed on an opposite surface (for example, the lower surface) of the printed circuit board 170. For example, the coupling hole 331*b* may be formed in an area in which the shield cover 333 contacts an opposite surface of the printed circuit board 170. In this case, a location of the coupling hole 331*b* may be determined in consideration of an arrangement of an electronic component (for example, a ground member) arranged on an opposite surface of the printed circuit board 170.

The shield cover 333 may include a cover part 333*a* that covers an upper side of the third electronic component 177 arranged on one surface (for example, the upper surface) of the printed circuit board 170, a side part 333*b* that is bent downwards from a portion of an edge of the cover part 333*a* to cover a side wall of the shield frame 331 and a side surface of the printed circuit board 170, a lower end 333*c* that is bent from a portion of an edge of the side part 333*b* towards an opposite surface (for example, the lower surface) of the printed circuit board 170 to cover an area of an opposite surface of the printed circuit board 170, and at least one coupling protrusion 333*d* that is formed in an area of the side part 333*b* and is coupled to at least one coupling hole 331*b* formed in a side wall of the shield frame 331.

According to various embodiments, the cover part 333*a* of the shield cover 333 may be seated and supported on an area that is formed at an upper end of the side wall of the first shield frame 331, that is, an upper area of the shield frame 331 formed in parallel to the upper surface of the third electronic component 177. According to various embodiments, the side part 333*b* of the shield cover 333 may extend from the cover part 333*a* and may be formed to cover the opening 331*a* and the coupling hole 331*b* formed in the side wall of the shield frame 331. According to various embodiments, a lower end 333*c* of the shield cover 333 may extend from the side part 333*b* to cover an area of an opposite surface (for example, the lower surface) of the printed circuit board 170.

Although the drawing illustrates that the side part 333*b* of the shield cover 333 has a plate form with a specific area and a specific thickness to cover the opening 331*a* formed in the side wall of the shield frame 331, the coupling hole 331*b*, and a side surface of the printed circuit board 170. In some embodiments, the remaining areas of the side part 333*b* of the shield cover 333 other than the opening 331*a* formed in the side wall of the shield frame 331, the coupling hole 331*b*, and the side surface of the printed circuit board 170 may or may not have an opening.

According to various embodiments, the coupling protrusions 333*d* formed on the side part 333*b* of the shield cover 333 may be arranged to correspond to the coupling holes 331*b* formed in the side wall of the shield frame 331, and may be inserted into and coupled to the coupling holes 331*b*. Accordingly, the shield cover 333 may be fixed to cover some of an upper portion of the third electronic component 177, the shield frame 331, the side surface of the printed circuit board 170, and a portion of an opposite surface (for example, a lower surface) of the printed circuit board 170.

Although the drawings (for example, FIGS. 3A to 6C) illustrate that the coupling hole formed in the shield frame and the coupling protrusion formed in the shield cover are coupled to each other such that the shield cover is fixed to the shield frame, the present disclosure is not limited thereto. In some embodiments, a coupling protrusion may be formed in the shield frame and a coupling hole may be formed in the shield cover to be coupled to the coupling protrusion. According to various embodiments, the shield can may include coupling members of various forms, such as a coupling hole and a coupling protrusion, by which the shield cover may be fixed to the shield frame. For example, the coupling hole and the coupling protrusion may be replaced by a screw member, a hook member, or a bonding member. According to another embodiment, the coupling hole may be replaced by a coupling recess.

According to various embodiments, the method for forming a second shielding area 230 through a second shield can 330 may include an operation of mounting at least one electronic component, for example, a third electronic component 177 on one surface (for example, the upper surface) of a printed circuit board 170 through a surface mounted device (SMD) process, an operation of coupling a shield frame to one surface (for example, the upper surface) of the printed circuit board 170 through an SMD process, an operation of covering some of an upper portion of the third electronic component 177, the shield frame 331, side surfaces of the printed circuit board 170, and an opposite surface (for example, the lower surface) of the printed circuit board 170 with a shield cover 333, and an operation of coupling a coupling protrusion 333*d* formed in the shield cover 333 to a coupling hole 331d formed in the shield frame 331.

As described above, according to various embodiments, an electronic device may include a housing comprising a first plate, a second plate that is separated from the first plate, and a side member that surrounds at least a portion of a space between the first plate and the second plate, a printed circuit board that is arranged inside the housing and that comprises a first surface that faces a first direction, a second surface that faces a second direction that is opposite to the first direction, and at least one side surface that faces a direction that is different from the first direction and the second direction, a first electronic component that is mounted on the first surface, a second electronic component that is mounted on the second surface, a first shield frame that is formed on the first surface to surround at least a part of the first electronic component and has a first opening in at least an area thereof, a second shield frame that is formed on the second surface to surround at least a part of the second electronic component and has a second opening in at least an area thereof, and a first shield cover comprising a first cover part and a first side part. The first cover part may be supported by the first shield frame and be formed to cover an upper portion of the first electronic component. The first side part may extend from the first cover part to a portion of the second shield frame and be formed to cover at least one side surface of the printed circuit board, the first opening, and at least a portion of the second opening.

According to various embodiments, the electronic device may further include a shielding layer that is supported by the second shield frame and is arranged to cover an upper portion of the second electronic component.

According to various embodiments, the shielding layer may be formed of a material that is softer than a material of the first shield cover.

According to various embodiments, the second shield frame may include a coupling member that is connected to the first shield cover such that the first shield cover is attached to and detached from the second shield frame.

According to various embodiments, the coupling member may include a coupling recess, the first shield cover may include a coupling protrusion that is arranged to correspond to the coupling recess, and the coupling protrusion may be inserted into and coupled to the coupling recess.

According to various embodiments, the first shield frame may include a coupling member that is connected to the first shield cover such that the first shield cover is attached to and detached from the first shield frame.

According to various embodiments, an area of at least one of the first shield frame and the second shield frame may be bent towards the first electronic component or the second electronic component to be parallel to an upper surface of the first electronic component or the second electronic component.

According to various embodiments, the electronic device may further include a second shield cover comprising a second cover part and a second side part. The second cover part may be supported by the second shield frame and be formed to cover an upper portion of the second electronic component. The second side part may be bent downwards from a portion of an edge of the second cover part to cover a portion of the second shield frame.

According to various embodiments, the second shield cover may be formed of a material that is the same as or similar to a material of the first shield cover.

According to various embodiments, the second shield frame may include a coupling member that is connected to the second shield cover such that the second shield cover is attached to and detached from the second shield frame.

According to various embodiments, the coupling member may include a coupling recess, the second shield cover may include a coupling protrusion that is arranged to correspond to the coupling recess, and the coupling protrusion may be inserted into and coupled to the coupling recess.

According to various embodiments, the first shield cover and the second shield cover may be spaced apart from each other on the second shield frame by a distance.

According to various embodiments, the second shield frame may be formed to cover an upper portion of the second electronic component.

According to various embodiments, the second shield frame may be bent from a portion of opposite edges thereof towards the second electronic component and extends from the bent areas by a length, and the extending ends of the second shield frame are coupled to each other to be integrally formed.

According to various embodiments, an electronic device may include a housing comprising a first plate, a second plate that is separated from the first plate, and a side member that surrounds at least a portion of a space between the first plate and the second plate, a printed circuit board that is arranged inside the housing and that comprises a first surface that faces a first direction, a second surface that faces a second direction that is opposite to the first direction, and at least one surface that faces a direction that is different from the first direction and the second direction, at least one electronic component that is mounted on the first surface, a shield frame that is formed on the first surface to surround at least a part of the at least one electronic component and has an opening in at least an area thereof, and a shield cover comprising a cover part, a side part, and a lower end. The cover part may be supported by the shield frame and be formed to cover an upper portion of the at least one electronic component. The side part may be bent downwards from a portion of an edge of the cover part and be formed to cover the opening and at least a portion of at least one side surface of the printed circuit board. The lower end may be bent from a portion of an edge of the side part towards the second surface and be formed to cover a portion of the second surface.

According to various embodiments, the shield frame may include a coupling member that is connected to the shield cover such that the shield cover is attached to and detached from the shield frame.

According to various embodiments, the coupling member may include a coupling recess, the shield cover may include a coupling protrusion that is arranged to correspond to the coupling recess, and the coupling protrusion may be inserted into and coupled to the coupling recess.

According to various embodiments, the printed circuit board may include a coupling member that connects the shield cover to an area of the second surface, which the lower end of the shield cover contacts, such that the shield cover is attached to and detached from the area of the second surface.

According to various embodiments, an area of the shield frame may be bent towards the at least one electronic component to be parallel to an upper surface of the at least one electronic component.

Figure 7:
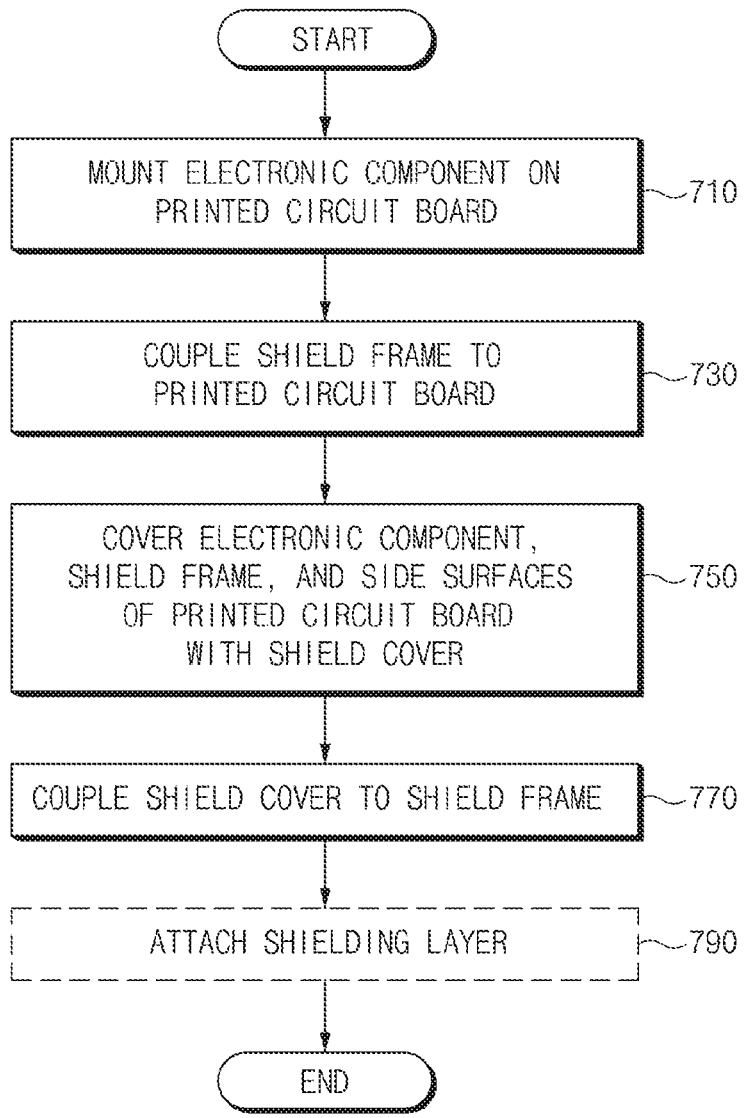
FIG. 7 illustrates a method for forming a shielding area through a shield can according to various embodiments of the present disclosure.

FIG. 7 is a flowchart illustrating a method for forming a shielding area through a shield can according to various embodiments of the present disclosure.

Referring to FIG. 7, in operation 710, at least one electronic component may be mounted on at least one surface of a printed circuit board. According to an embodiment, a first electronic component may be mounted on an upper surface of the printed circuit board through an SMD process, and a second electronic component may be mounted on a lower surface of the printed circuit board. According to various embodiments, a third electronic component may be mounted on one surface of the printed circuit board through an SMD process.

In operation 730, at least one shield frame may be coupled to at least one surface of the printed circuit board. According to an embodiment, a first shield frame may be coupled to an upper surface of the printed circuit board and a second shield frame may be coupled to a lower surface of the printed circuit board, through an SMD process. According to another embodiment, a shield frame may be coupled to a surface on which the third electronic component arranged on one surface of the printed circuit board is placed through an SMD process.

In operation 750, the shield cover may cover the electronic components, the shield frame, and the side surfaces of the printed circuit board. According to an embodiment, the shield cover may cover an upper side of a first electronic component arranged on an upper surface of the printed circuit board, a first shield frame arranged on the upper surface of the printed circuit board, side surfaces of the printed circuit board, and at least a portion of a second shield frame arranged on a lower surface of the printed circuit board. According to another embodiment, the shield cover may cover an upper portion of a third electronic component arranged on one surface of a printed circuit board, a shield frame arranged on a surface on which the third electronic component arranged on one surface of the printed circuit board is placed, side surfaces of the printed circuit board, and a portion of a surface that is opposite to the s on which the third electronic component is arranged on the printed circuit board.

In operation 770, the shield cover may be coupled to the shield frame. According to an embodiment, at least one coupling protrusion formed in the shield cover may be coupled to at least one coupling hole formed in the second shield frame arranged on a lower surface of the printed circuit board. According to an embodiment, at least one coupling protrusion formed in the shield cover may be coupled to at least one coupling hole formed in the second shield frame arranged on an upper surface of the printed circuit board. In some embodiments, at least one coupling protrusion formed in the shield cover may be coupled to a coupling hole formed on a surface that is opposite to the surface on which the third electronic component is arranged on the printed circuit board.

In operation 790, a shielding layer may be attached to cover an area that is not surrounded by the shield cover. In an embodiment, a shielding layer may be attached to an upper end of the second shield frame arranged on the lower surface of the printed circuit board to cover an upper side of the second electronic component.

According to various embodiments, operation 790 may be omitted or may be replaced by another operation. In an embodiment, not the shielding layer but a second shield cover may cover an upper portion of the second electronic component arranged on the lower surface of the printed circuit board and a portion of the second shield frame. In this case, at least one coupling protrusion formed in the second shield cover may be coupled to at least one coupling hole formed in the second shield frame. According to another embodiment, when the shield frame is coupled to the printed circuit in operation 730, a second shield frame that covers an upper side of a second electronic component arranged on the lower surface of the printed circuit board may be coupled.

As described above, according to various embodiments, a method for forming a shielding area of an electronic device may include mounting a first electronic component on a first surface of a printed circuit board arranged inside a housing of the electronic device and a second electronic component on a second surface of the printed circuit board through a surface mounted device (SMD) process, coupling a first shield frame to the first surface and a second shield frame to the second surface through an SMD process, covering at least some of an upper portion of the first electronic component, the first shield frame, side surfaces of the printed circuit board, and the second shield frame with a shield cover, coupling the shield cover to a coupling member formed in the second shield frame, and attaching an shielding layer to an upper end of the second shield frame such that the shielding layer covers an upper portion of the second electronic component.

According to embodiments of the present disclosure, an electromagnetic wave shielding function can be improved by providing a structure of a shield can in which a shield cover covers an opening formed in a shield frame and a portion of a side wall of a printed circuit board.

In addition, the present disclosure may provide various effects that are directly or indirectly recognized.

The term "module" used herein may represent, for example, a unit including one of hardware, software and firmware or a combination thereof. The term "module" may be interchangeably used with the terms "unit", "logic", "logical block", "component" and "circuit". The "module" may be a minimum unit of an integrated component or may be a part thereof. The "module" may be a minimum unit for performing one or more functions or a part thereof. The "module" may be implemented mechanically or electronically. For example, the "module" may include at least one of an application-specific integrated circuit (ASIC) chip, a field-programmable gate array (FPGA), and a programmable-logic device for performing some operations, which are known or will be developed.

At least a part of devices (e.g., modules or functions thereof) or methods (e.g., operations) according to various embodiments of the present disclosure may be implemented as instructions stored in a computer-readable storage medium in the form of a program module. In the case where the instructions are performed by a processor, the processor may perform functions corresponding to the instructions. The computer-readable storage medium may be, for example, the memory.

A computer-readable recording medium may include a hard disk, a floppy disk, a magnetic medium (e.g., a magnetic tape), an optical medium (e.g., CD-ROM, digital versatile disc (DVD)), a magneto-optical medium (e.g., a floptical disk), or a hardware device (e.g., a ROM, a RAM, a flash memory, or the like). The program instructions may include machine language codes generated by compilers and high-level language codes that can be executed by computers using interpreters. The above-mentioned hardware device may be configured to be operated as one or more software modules for performing operations of various embodiments of the present disclosure and vice versa.

A module or a program module according to various embodiments of the present disclosure may include at least one of the above-mentioned elements, or some elements may be omitted or other additional elements may be added. Operations performed by the module, the program module or other elements according to various embodiments of the present disclosure may be performed in a sequential, parallel, iterative or heuristic way. Furthermore, some operations may be performed in another order or may be omitted, or other operations may be added.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. An electronic device comprising:
   a housing comprising a first plate, a second plate separated from the first plate, and a side member surrounding at least a portion of a space between the first plate and the second plate;
   a printed circuit board arranged inside the housing and comprises a first surface facing a first direction, a second surface that faces a second direction that is opposite to the first direction, and at least one side surface that faces a direction that is different from the first direction and the second direction;
   a first electronic component mounted on the first surface;
   a second electronic component mounted on the second surface;
   a first shield frame formed on the first surface to surround at least a part of the first electronic component and has a first opening in at least an area thereof;
   a second shield frame formed on the second surface to surround at least a part of the second electronic component and has a second opening in at least an area thereof; and
   a first shield cover comprising a first cover part and a first side part,
   wherein the first cover part is supported by the first shield frame and is formed to cover an upper portion of the first electronic component, and
   wherein the first side part extends from the first cover part to a portion of the second shield frame and is formed to cover at least one side surface of the printed circuit board, the first opening, and at least a portion of the second opening.

2. The electronic device of claim 1, further comprising:
   a shielding layer supported by the second shield frame and arranged to cover an upper portion of the second electronic component.

3. The electronic device of claim 2, wherein the shielding layer is formed of a material that is softer than a material of the first shield cover.

4. The electronic device of claim 1, wherein the second shield frame comprises a coupling member connected to the first shield cover in a manner that the first shield cover is attached to and detached from the second shield frame.

5. The electronic device of claim 4, wherein the coupling member comprises a coupling recess, the first shield cover comprises a coupling protrusion arranged to correspond to the coupling recess, and the coupling protrusion is inserted into and coupled to the coupling recess.

6. The electronic device of claim 1, wherein the first shield frame comprises a coupling member connected to the first shield cover in a manner that the first shield cover is attached to and detached from the first shield frame.

7. The electronic device of claim 1, wherein a bent area of at least one of the first shield frame and the second shield frame is bent towards the first electronic component or the second electronic component to be parallel to an upper surface of the first electronic component or the second electronic component.

8. The electronic device of claim 1, further comprising:
   a second shield cover comprising a second cover part and a second side part,
   wherein the first cover part is supported by the second shield frame and is formed to cover an upper portion of the second electronic component, and
   wherein the second side part is bent downwards from a portion of an edge of the second cover part to cover a portion of the second shield frame.

9. The electronic device of claim 8, wherein the second shield cover is formed of a material that is the same as or similar to a material of the first shield cover.

10. The electronic device of claim 8, wherein the second shield frame comprises a coupling member connected to the second shield cover in a manner that the second shield cover is attached to and detached from the second shield frame.

11. The electronic device of claim 10, wherein the coupling member comprises a coupling recess, the second shield cover comprises a coupling protrusion arranged to correspond to the coupling recess, and the coupling protrusion is inserted into and coupled to the coupling recess.

12. The electronic device of claim 8, wherein the first shield cover and the second shield cover are spaced apart from each other on the second shield frame by a distance.

13. The electronic device of claim 1, wherein the second shield frame is formed to cover an upper portion of the second electronic component.

14. The electronic device of claim 13, wherein the second shield frame is bent from a portion of opposite edges thereof towards the second electronic component and extends from the bent portion of the opposite edges by a length, and the opposite edges extending from the bent portion of the second shield frame are coupled to each other to be integrally formed.

15. An electronic device comprising:
   a housing comprising a first plate, a second plate separated from the first plate, and a side member surrounding at least a portion of a space between the first plate and the second plate;
   a printed circuit board arranged inside the housing and comprises a first surface facing a first direction, a second surface facing a second direction opposite to the first direction, and at least one surface facing a direction different from the first direction and the second direction;
   at least one electronic component mounted on the first surface;
   a shield frame formed on the first surface to surround at least a part of the at least one electronic component and has an opening in at least an area thereof; and
   a shield cover comprising a cover part, a side part, and a lower end,
   wherein the cover part is supported by the shield frame and is formed to cover an upper portion of the at least one electronic component,
   wherein the side part is bent downwards from a portion of an edge of the cover part and is formed to cover the opening and at least a portion of at least one side surface of the printed circuit board, and
   wherein the lower end is bent from a portion of an edge of the side part towards the second surface and is formed to cover a portion of the second surface.

16. The electronic device of claim 15, wherein the shield frame comprises a coupling member connected to the shield cover in a manner that the shield cover is attached to and detached from the shield frame.

17. The electronic device of claim 16, wherein the coupling member comprises a coupling recess, the shield cover comprises a coupling protrusion arranged to correspond to the coupling recess, and the coupling protrusion is inserted into and coupled to the coupling recess.

18. The electronic device of claim 15, wherein the printed circuit board comprises a coupling member that connects the shield cover to an area of the second surface, which the lower end of the shield cover contacts, in a manner that the shield cover is attached to and detached from the area of the second surface.

19. The electronic device of claim 15, wherein an area of the shield frame is bent towards the at least one electronic component to be parallel to an upper surface of the at least one electronic component.

20. A method for forming a shielding area of an electronic device, the method comprising:
   mounting a first electronic component on a first surface of a printed circuit board arranged inside a housing of the electronic device and a second electronic component on a second surface of the printed circuit board through a surface mounted device (SMD) process;
   coupling a first shield frame to the first surface and a second shield frame to the second surface through an SMD process;
   covering at least some of an upper portion of the first electronic component, the first shield frame, side surfaces of the printed circuit board, and the second shield frame with a shield cover;
   coupling the shield cover to a coupling member formed in the second shield frame; and
   attaching a shielding layer to an upper end of the second shield frame in a manner that the shielding layer covers an upper portion of the second electronic component.

* * * * *